United States Patent
Sun et al.

(10) Patent No.: US 11,194,356 B2
(45) Date of Patent: Dec. 7, 2021

(54) LINEAR STAGE EFFICIENCY TECHNIQUES FOR H-BRIDGE SYSTEMS

(71) Applicant: Analog Devices International Unlimited Company, Limerick (IE)

(72) Inventors: Fu Sun, Colorado Springs, CO (US); Xiaohua Su, Hangzhou (CN); Stephen Todd Van Duyne, Calhan, CO (US); Yanfeng Lu, Shanghai (CN); Mathew Todd Wich, Colorado Springs, CO (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/886,451

(22) Filed: May 28, 2020

(65) Prior Publication Data
US 2020/0409400 A1 Dec. 31, 2020

Related U.S. Application Data

(60) Provisional application No. 62/868,329, filed on Jun. 28, 2019.

(51) Int. Cl.
*H02M 1/00* (2006.01)
*G05F 1/565* (2006.01)
(Continued)

(52) U.S. Cl.
CPC ............. *G05F 1/56* (2013.01); *H02M 1/00* (2013.01); *H02M 3/155* (2013.01); *H03F 3/21* (2013.01);
(Continued)

(58) Field of Classification Search
CPC .................... H02M 1/0045; H02M 3/158
(Continued)

(56) References Cited

U.S. PATENT DOCUMENTS 5,905,407 A * 5/1999 Midya ................ H03F 1/0222
330/10
6,486,643 B2 11/2002 Liu
(Continued)

FOREIGN PATENT DOCUMENTS

WO WO-2019148484 A1 8/2019

OTHER PUBLICATIONS

Ertl, Hans, et al., "Basic Considerations and Topologies of Switched-Mode Assisted Linear Power Amplifiers", IEEE Transactions on Industrial Electronics, 44(1, (Feb. 1997), 116-123.
(Continued)

*Primary Examiner* — Gary A Nash
(74) *Attorney, Agent, or Firm* — Schwegman Lundberg & Woessner, P.A.

(57) ABSTRACT

Techniques for efficient operation of a linear stage in an H-bridge system are provided. In an example, a linear stage can switch between voltage regulation and current regulation over a range of a command signal. The particular regulation mode can depend on the regulation mode of a switched stage of the H-bridge system. Efficiency can be realized by using current regulation of the linear stage when the output voltage of the linear stage moves away from the voltage of a supply rail. Such a control scheme can reduce the voltage across the linear stage for a larger range of the command signal resulting in less heat dissipation of the linear stage compared to conventional control of H-bridge linear stages.

20 Claims, 10 Drawing Sheets

(51) Int. Cl.
*G05F 1/59* (2006.01)
*G05F 1/575* (2006.01)
*H02M 3/158* (2006.01)
*G05F 1/56* (2006.01)
*H02M 3/155* (2006.01)
*H03F 3/21* (2006.01)

(52) U.S. Cl.
CPC .............. *G05F 1/565* (2013.01); *G05F 1/575* (2013.01); *G05F 1/59* (2013.01); *H02M 1/0045* (2021.05); *H02M 3/158* (2013.01)

(58) Field of Classification Search
USPC ................................ 323/268, 273–275, 280
See application file for complete search history.

(56) References Cited

U.S. PATENT DOCUMENTS

| | | | |
|---|---|---|---|
| 8,145,151 | B2 | 3/2012 | Nentwig |
| 9,831,839 | B2 | 11/2017 | King et al. |
| 2002/0089316 | A1* | 7/2002 | Liu .......................... H03F 3/211 323/268 |
| 2002/0097090 | A1 | 7/2002 | Smedegaard-pedersen et al. |
| 2004/0095183 | A1 | 5/2004 | Swize |
| 2006/0132112 | A1* | 6/2006 | Oswald ................ H02M 3/1584 323/282 |
| 2006/0250825 | A1 | 11/2006 | Grigore |
| 2011/0279183 | A1* | 11/2011 | Froidevaux ........... H03F 1/0205 330/291 |
| 2015/0155783 | A1* | 6/2015 | Li .......................... H03F 1/0227 323/271 |
| 2015/0160669 | A1* | 6/2015 | Marschalkowski ....... G05F 1/59 323/273 |
| 2015/0188432 | A1* | 7/2015 | Vannorsdel ............ H03F 3/2173 323/271 |
| 2019/0148484 | A1 | 5/2019 | Kowalik-seidl et al. |

OTHER PUBLICATIONS

Walker, Geoffrey R, "A Class B Switch-Mode Assisted Linear Amplifier", IEEE Transactions on Power Electronics, 18(6), (Nov. 2003), 1278-1285.

* cited by examiner

US 11,194,356 B2

LINEAR STAGE EFFICIENCY TECHNIQUES FOR H-BRIDGE SYSTEMS

CLAIM OF PRIORITY

This application claims the benefit of priority to Sun et al., U.S. Provisional Patent Application Ser. No. 62/868,329, titled, LINEAR STAGE EFFICIENCY TECHNIQUES FOR H-BRIDGE SYSTEMS, filed Jun. 28, 2019 and hereby incorporated by reference herein in its entirety.

TECHNICAL FIELD OF THE DISCLOSURE

The present disclosure relates to techniques for saving power, and more particularly to power dissipation management techniques for a linear power stage of H-bridge systems.

BACKGROUND

H-bridge systems, among other things, can allow a load to be driven using bipolar voltage or current when only a single polarity power source is available. Such a system can a have a first power stage coupled to a first supply terminal of the load and a second power stage coupled to a second supply terminal of the load. Although the output voltage of each terminal is referenced to a common voltage such as ground, coordinated control of the two power stages can allow the load to receive a bipolar voltage. Switched-mode power stages can offer very good efficiency compared to linear power stages, which regulate voltage by dropping a voltage across an active or passive resistive element, which consumes power. However, switch power stages can generate a rippled output voltage and can be more complex, bulkier, and more expensive than comparable liner power stages. Also, switched power stages do not provide a full range of output voltage as compared to a linear power stage.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized that some approaches to an H-bridge circuit can utilize a combination of a switched power converter and a linear power converter in an H-bridge configuration. However, such an implementation can wastefully dissipate a significant amount of power in the linear power converter, leaving an opportunity for improvement. The present subject matter provides techniques for improving efficiency of the linear stage by better controlling power dissipation of the linear power converter.

Figure 1A:
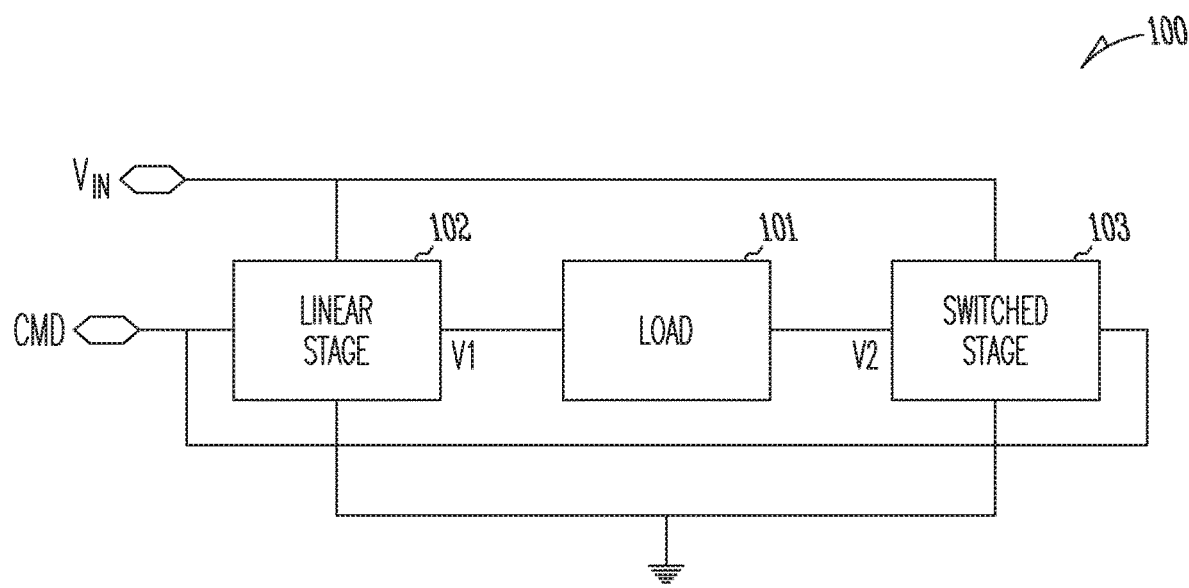
FIG. 1A illustrates an example H-bridge system according to the present subject matter.

FIG. 1A illustrates an example H-bridge system 100 according to the present subject matter. The system 100 can be coupled to a load 101. The system 100 can include a first power stage 102, and a second power stage 103. In certain examples, a power stage can also be referred to as a power converter, a drive, a regulator, etc. In certain examples, one of the first or second power stages 102, 103 can include a linear regulator power stage ("linear stage"), such as can regulate a supply voltage by controlling a voltage drop across an active or passive regulation resistive element. The H-bridge system 100 can be configured such as shown in FIG. 1A, such as to have the linear stage 102 coupled to a first of two power terminals of the load 101, and to have the switched stage 103 coupled to the other of the two power terminals of the load 101. This configuration, such as shown in FIG. 1A, can allow the load 101 to be driven with a range of differential voltages (e.g., $V_1-V_2$), such as while using a single polarity supply voltage ($V_{IN}$). Another approach could use two switched stages, which can be very efficient, but which may not meet output ripple requirements. Also, switched stages can include a reactive component, such as an inductor, which can add complexity and expense. The H-bridge system approach shown in FIG. 1A can replace one of the switched stages with an inexpensive and less complex linear stage 102, which can be very inefficient, such as in an application that involves a large voltage drop across one of the regulating active resistances such as provided by output transistors of the linear stage 102. A larger voltage drop across an active output transistor can result in significant power dissipation within the linear stage 102, such that the power that is delivered to the load 101 is delivered thereto less efficiently.

The present inventors have recognized techniques for improving the efficiency of a linear power stage 102 in an H-bridge system. Efficiency of an H-bridge system can be improved by reducing the amount of power dissipated by the first and second power converters 102, 103. For example, power dissipation in a linear stage 102 can be estimated, such as based on the voltage across the active output transistor of the linear stage 102 and the current provided to the load 101 by the linear stage 102. In certain examples, the load 101 included in or coupled to an H-bridge system 100 can include, but is not limited to, a resistive load, such as a heater or light, a motor, a thermoelectric device, or any combination thereof.

For example, each power stage 102, 103 of the H-bridge system 100 can be configured to receive a controlling command signal (CMD). One or each of the power stages 102, 103 can be arranged to have a transfer function that can depend upon the value of the command signal (CMD). For example, the command signal (CMD) can specify a particular output voltage to provide at the output of the linear stage 102. For the switched stage 103, the command signal (CMD) can specify a particular differential voltage to apply across the load 101 or can operate in a current regulation mode. Such control can allow a non-linear load 101, such as a thermoelectric device, to be driven in a somewhat linear fashion.

Figure 1B:
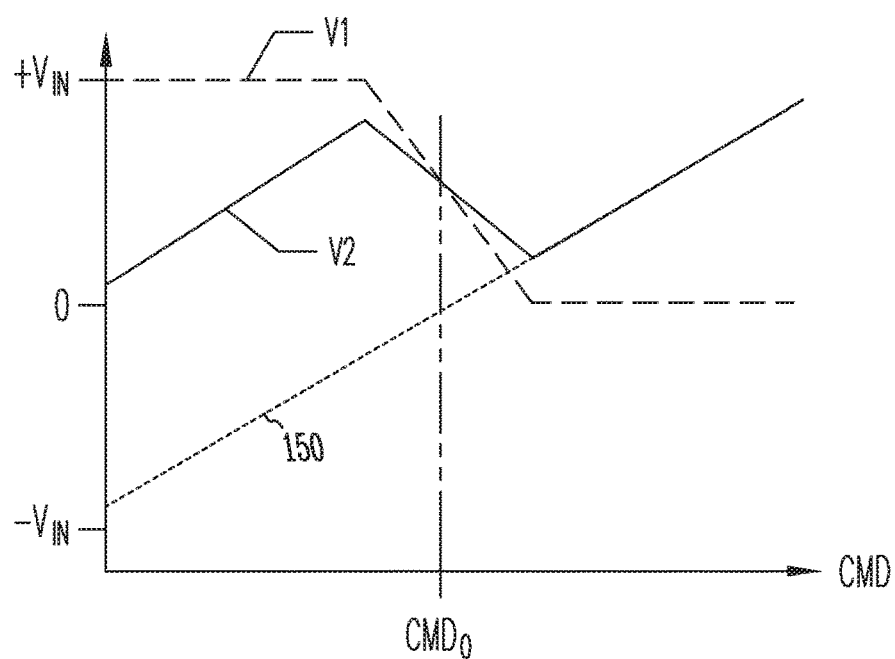
FIG. 1B illustrates graphically a differential voltage response of an example H-bridge system with respect to a command signal and a plot of the output voltage of each driver with respect to the command signal.
Figure 1C:
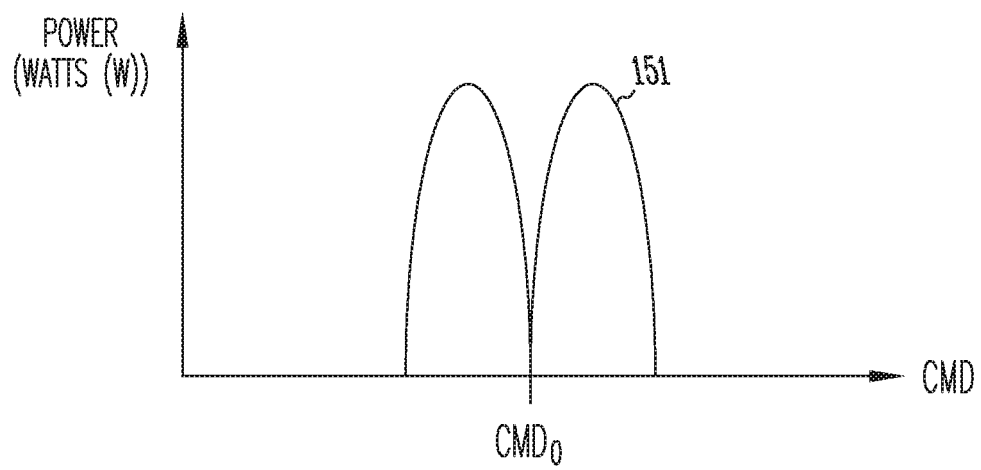
FIG. 1C illustrates graphically the power dissipation of the linear stage of the example H-bridge system for a resistive load when operated with respect to the plot of FIG. 1B.

FIG. 1B illustrates graphically a differential voltage response 150 of an example H-bridge system with respect to a command signal (CMD) and a plot of the output voltage (V1, V2) of the respective linear and switched stages with respect to the command signal. FIG. 1B can be representative of an H-bridge system without power compensation but is not so limited. FIG. 1C illustrates graphically an example of the power dissipation 151 of the linear stage of an H-bridge system for a resistive load, when operated in accordance with what is shown in FIG. 1B. As shown in FIGS. 1B-1C, the linear stage of the H-bridge system dissipates little if any power when the output (V1) of the linear stage is pinned to ground or to the supply voltage ($V_{IN}$) of the linear supply. The linear stage, at least for a resistive load, can also show very little power dissipation when the differential voltage across the resistive load is at or near zero volts (e.g., when CMD=$CMD_0$). In general, the power dissipation of the linear stage can be represented by the product of the current at the output of the linear stage and the voltage across the regulating active output transistor of the linear stage.

Figure 2:
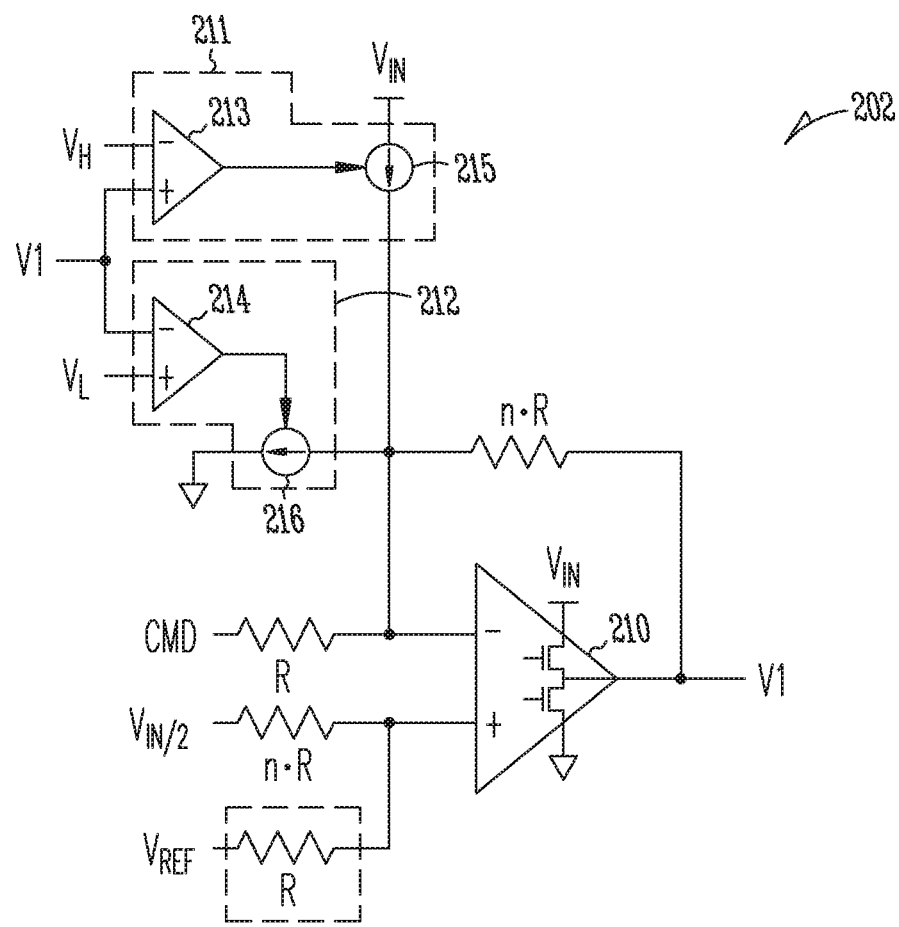
FIG. 2 illustrates generally an example linear power stage for an example H-bridge system such as, but not limited to, the H-bridge system of FIG. 1.

FIG. 2 illustrates generally an example of a linear power stage 202 such as can be included in the H-bridge system 100 of FIG. 1. For example, the linear power stage 202 can include a power amplifier 210, a number of gain resistors (R, n·R), and a pair of power limiting circuits 211, 212 coupled to a feedback network of the power amplifier 210. Each power limiting circuit 211, 212 can include a comparator circuit 213, 214 and a current source 215, 216. The gain resistors can operate to shape the response of the linear stage 202 such that the slope of its voltage response as the linear stage 202 provides half the supply voltage (e.g., $V_{IN}$/2) is steeper than that of the uncompensated response in the same region. The slope of the voltage response of the linear stage 202 can also be shaped by the power limiting circuits 211, 212, such as to reduce the response slope of the linear stage 202 when the output voltage (V1) of the linear stage 202 is near the supply voltage ($V_{IN}$) or is near ground. A fixed or adjustable reference voltage ($V_{REF}$) can optionally be applied to the non-inverting input of the power amplifier 210, such as to provide an offset with respect to the command signal (CMD).

As discussed above, the power limiting circuits 211, 212 can operate to relax the slope of the response of the linear stage 202 such as when the output voltage (V1) of the linear stage is near one of the supply rails ($V_{IN}$, ground), for example. Each power limiting circuit 211, 212 can receive a fixed or adjustable threshold ($V_H$, $V_L$) and a representation of the voltage output (V1) of the linear power amplifier 210. For example, the command signal (CMD) can provide the representation of the voltage output (V1) of the power amplifier 210. A first power limiting circuit 211 can include or be coupled to a corresponding current source 215, which can be enabled to inject current into the feedback path of the power amplifier 210 when the output voltage (V1), or representation thereof, of the power amplifier 210 is above a high threshold ($V_H$) value, such as can be determined by the comparator circuitry. A second power limiting circuit 212 can include or be coupled to a corresponding current source 216 to divert current from the feedback path of the linear power amplifier 210 when the output voltage (V1), or representation thereof, of the power amplifier 210 is below a low threshold ($V_L$), such as can be determined by comparator circuitry. When the output voltage (V1), or representation thereof, of the power amplifier 210 is between the high threshold ($V_H$) and the low threshold ($V_L$), the current sources 215, 216 of the first and second power limiting circuits 211, 212 can be disabled, such that the response of the power amplifier 210 to the command signal (CMD) can be shaped by the gain resistors (R, n·R). In operation, the linear stage 202 can be controllably operated near the supply rails through an extended range of the command signal (CMD) when the power amplifier 210 is operating in a linear region, for example when the output pf the amplifier circuit is transitioning the output voltage (V1) between the input supply ($V_{IN}$) and ground. Doing so can reduce the amount of power dissipation in the linear stage 202.

Figure 3A:
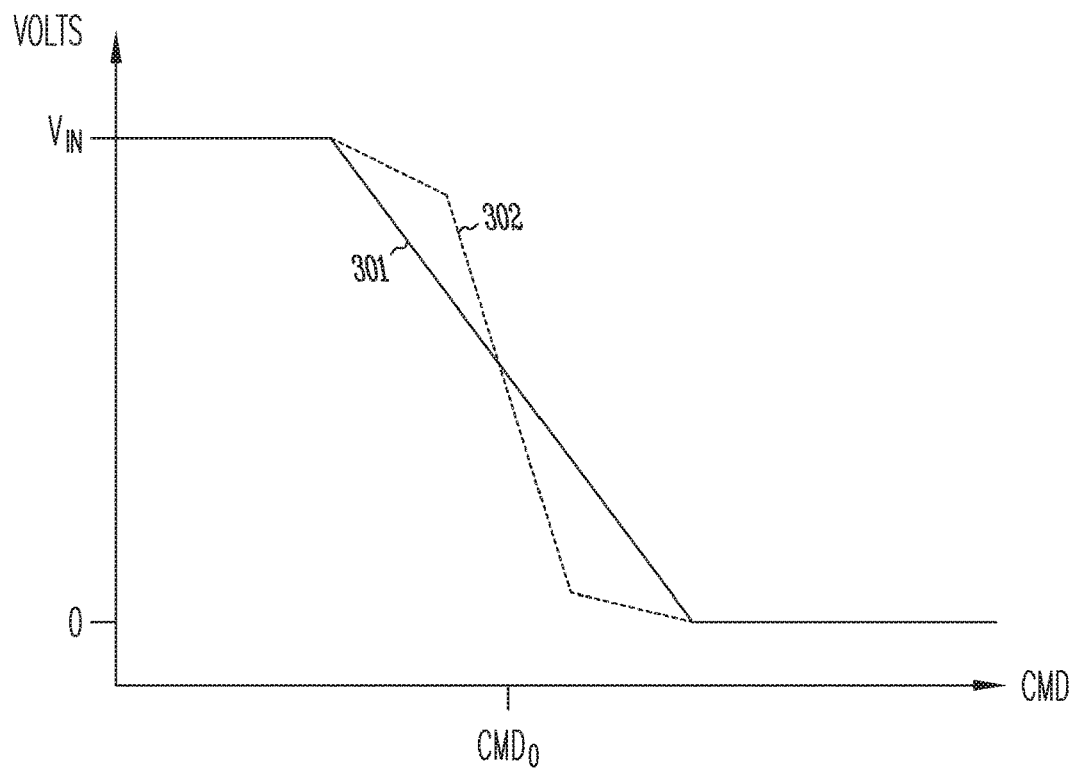
FIGS. 3A and 3B illustrate graphically the difference between power dissipation of an uncompensated H-bridge system and the example H-bridge system of FIG. 1 employing a linear stage according to the example of FIG. 2.
Figure 3B:
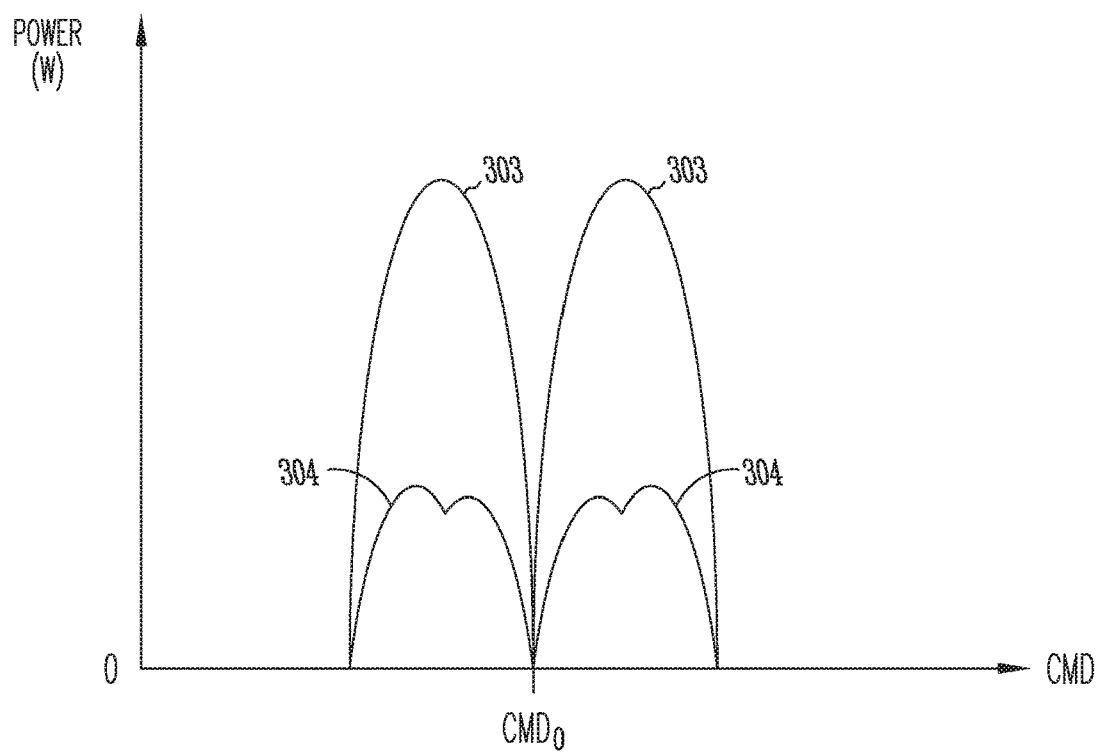

FIGS. 3A and 3B illustrate graphically an example of the difference between power dissipation of an uncompensated H-bridge system and the H-bridge system 100 of FIG. 1 employing a linear stage 202 of FIG. 2. FIG. 3A illustrates generally a first plot 301 of an output voltage of an uncompensated linear stage with respect to a command signal (CMD) and a second plot 302 of an output voltage of a compensated linear stage with respect to the command signal (CMD). The first plot 301 shows the output voltage of the linear stage transitioning with a constant slope between the supply voltage ($V_{IN}$) and ground as the command signal (CMD) changes. The second plot 302 shows the transition of the output voltage of the linear stage with multiple slopes between the supply voltage ($V_{IN}$) and ground as the command signal (CMD) changes. The slopes can be established to maintain the output voltage of the linear stage near the supply extremes through a greater portion of the range of the command signal (CMD). Such operation of the linear stage near the supply extremes generally represents more efficient operation of the H-bridge system.

FIG. 3B illustrates generally that the power dissipation of the compensated linear stage can be much less than a corresponding uncompensated linear stage. For example, a first plot 303 of FIG. 3B illustrates the power dissipation of an uncompensated linear stage and shows peak power dissipation when the uncompensated linear stage is providing about ¾ $V_{IN}$ at its output and ¼ $V_{IN}$ at its output. In contrast, the second plot 304 of FIG. 3B shows the power dissipation of the compensated linear stage with respect to the command signal (CMD) and again shows peak power dissipation when the compensated linear stage is providing about ¾ $V_{IN}$ at its output and ¼ $V_{IN}$ at its output. However, the peak dissipation of the uncompensated linear stage is about 2.4 times higher than the peak power dissipation of the compensated linear stage, in this example, because the most inefficient areas of operation of the compensated linear power stage have been pushed toward the supply voltage extremes such that there is less voltage across the active regulation transistor of the linear stage. When used in conjunction with a switched power stage, such as in the H-bridge configuration shown in FIG. 1A, because the switched power stage operates in a current regulation mode, the switched power stage has a degree of freedom in providing an appropriate output voltage such as to maintain a desired differential voltage across the load, while compensating the linear stage using the command signal (CMD).

Figure 4:
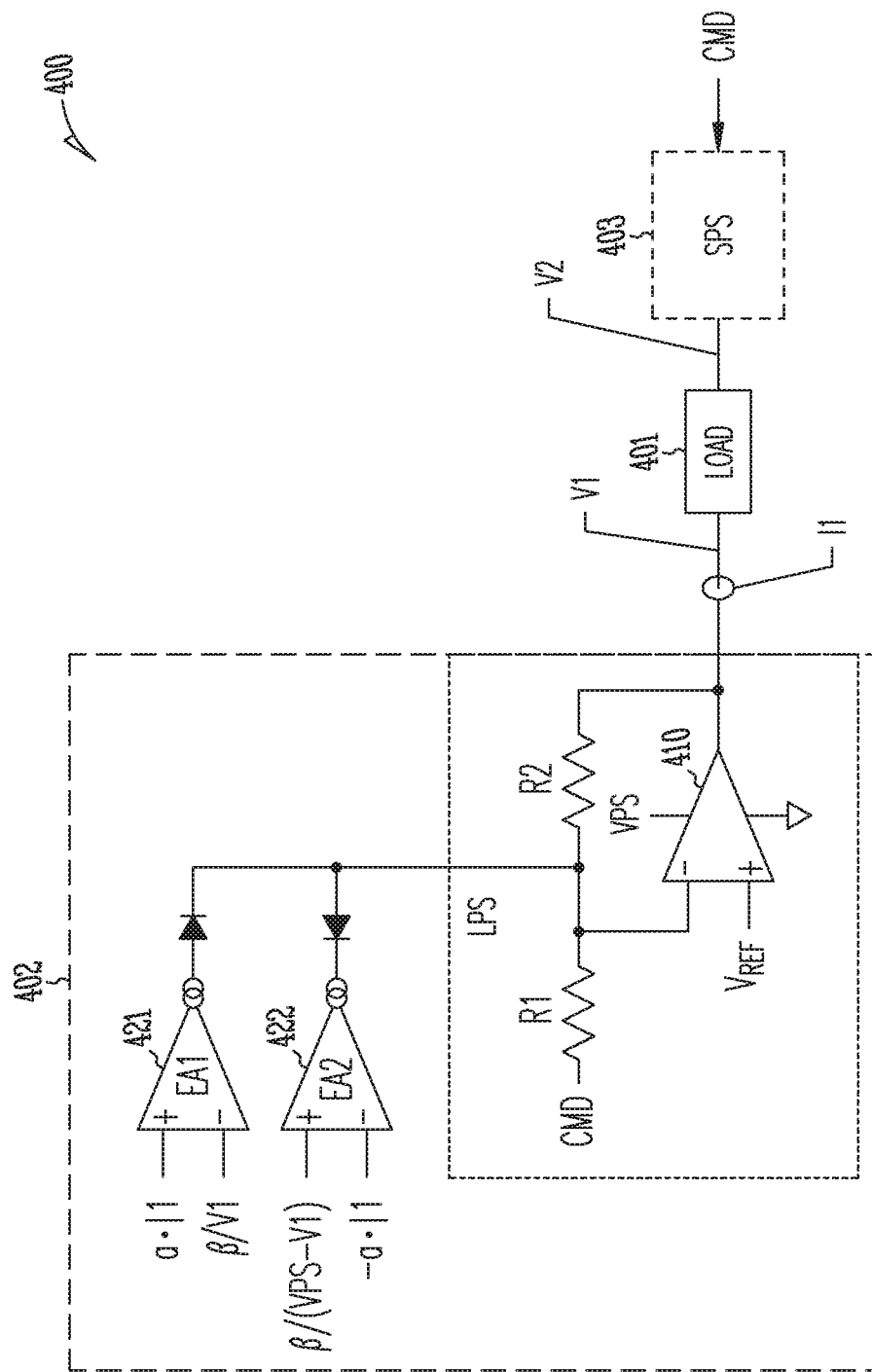
FIG. 4 illustrates generally an H-bridge system with an example linear power stage or power converter according to the present subject matter.

FIG. 4 illustrates generally an H-bridge system 400 with an example of a linear stage 402 or power converter, e.g., compensated or power limited according to the present subject matter. The H-bridge system 400 can include or be coupled to the load 401, and can include a switched stage 403, and the linear stage 402. The linear stage 402 can include a power amplifier 410 coupled to the supply ($V_{IN}$), first current control circuitry such as can include a first transconductance amplifier 421 and second current control circuitry such as can include a second transconductance amplifier 422. Each of the first and second transconductance amplifiers 421, 422 can receive a representation of the output voltage (V1) of the power amplifier 410 and a representation of the load current (I1) of the system 400. When the power dissipation of the linear stage 402 reaches a certain level, one of the transconductance amplifiers 421, 422 can start to adjust the output voltage (V1) of the power amplifier 410 such that the power dissipation of the linear stage 402 does not tend to increase, as it would otherwise do. Thus, the transconductance amplifiers 421, 422 function as a power limit circuit. In certain examples, the power amplifier 410 may be referred to as a linear amplifier.

For example, the representation of the output voltage of the linear stage 402 can be $\beta/V1$, and the representation of the load current can be $\alpha \cdot I1$, where V1 is the output voltage of the linear stage 402 and I1 is the current at the output of the linear stage 402. For example, the current (I1) at the output of the power amplifier 410 can be defined as being positive when current flows into the linear power amplifier 410. As the power dissipation of the power amplifier 410 increases while the amplifier is sinking current, the first transconductance amplifier 421 can become active and can try to make $\alpha \cdot I1$ equal $\beta/V1$. In this manner, the transconductance amplifiers 421, 422 attempts to limit the power dissipation of the linear power amplifier 410 such as to a near constant value of $\beta/\alpha$. In practice, the transconductance amplifiers 421, 422 can inject or remove current to raise or lower the output voltage (V1) of the power amplifier 410 to limit the power dissipation. In certain examples, the switched stage 403 can operate in a current regulation mode and can maintain a differential voltage (e.g., V1−V2) across the load 401 consistent with the command signal (CMD) even when the output voltage (V1) of the linear stage 402 adjusts to limit power dissipation in the linear stage 402. When current is sourced by the linear stage 402, the second transconductance amplifier 422 can become active to limit the power dissipation of the power amplifier 410.

Figure 5A:
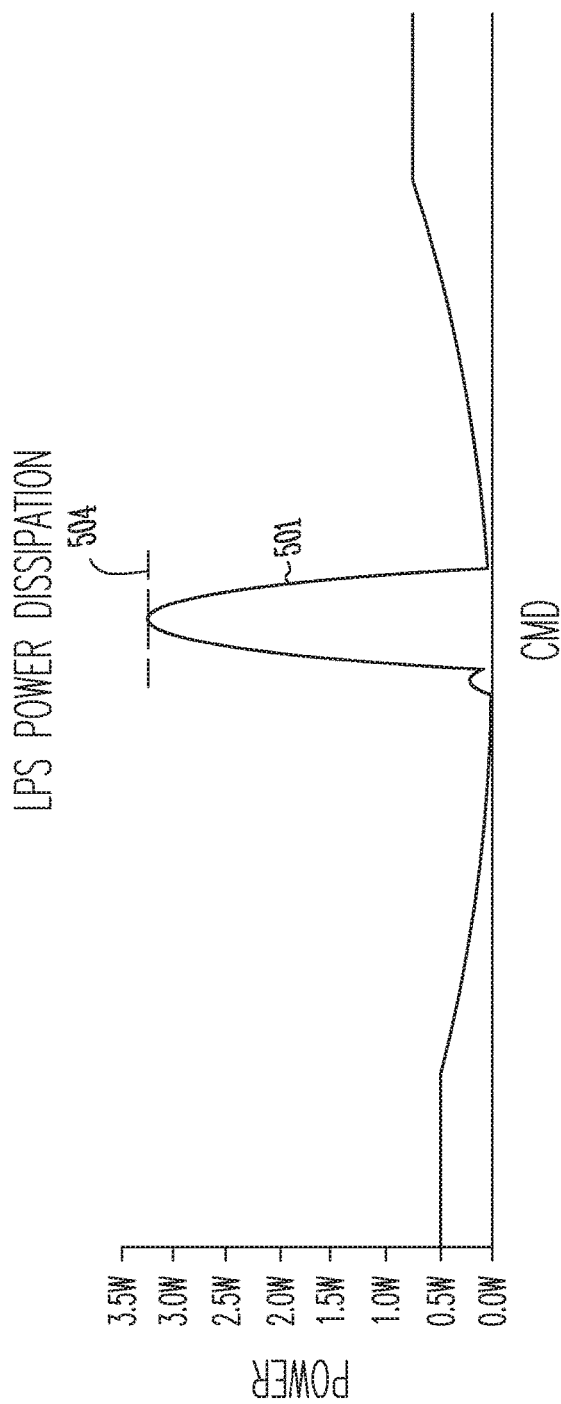
FIGS. 5A and 5B illustrate a comparison of the power dissipation and voltage characteristics of the example of FIG. 4 with operation of an uncompensated H-bridge system with a linear power converter.
Figure 5A:
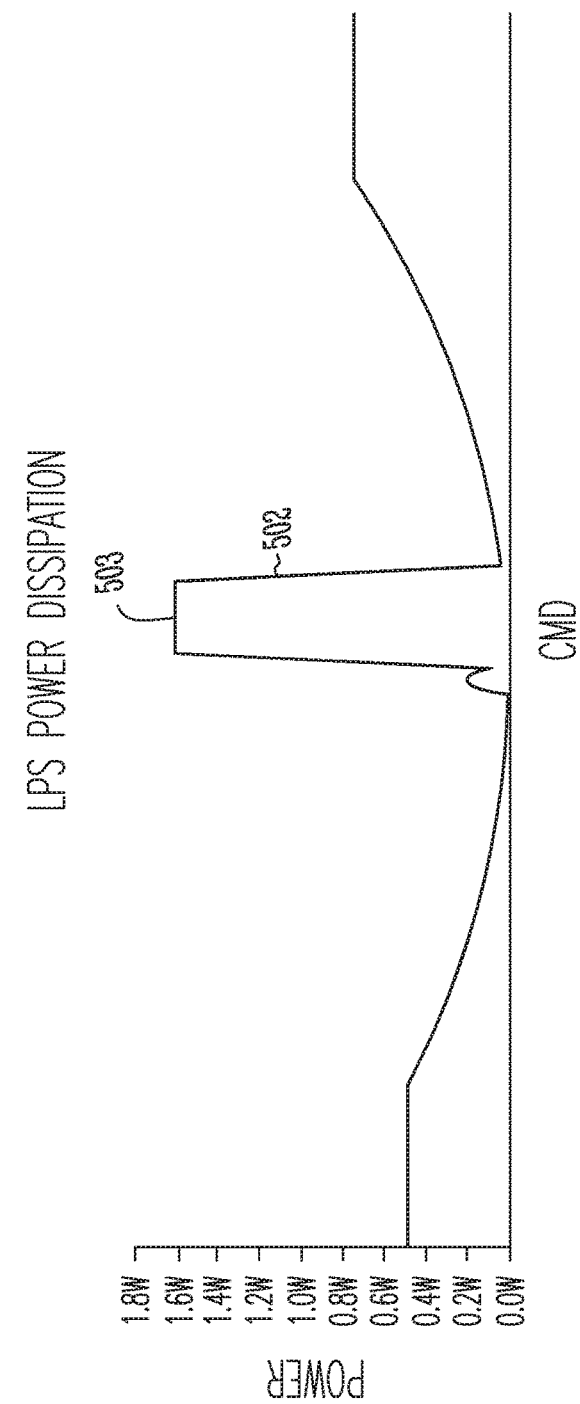
Figure 5B:
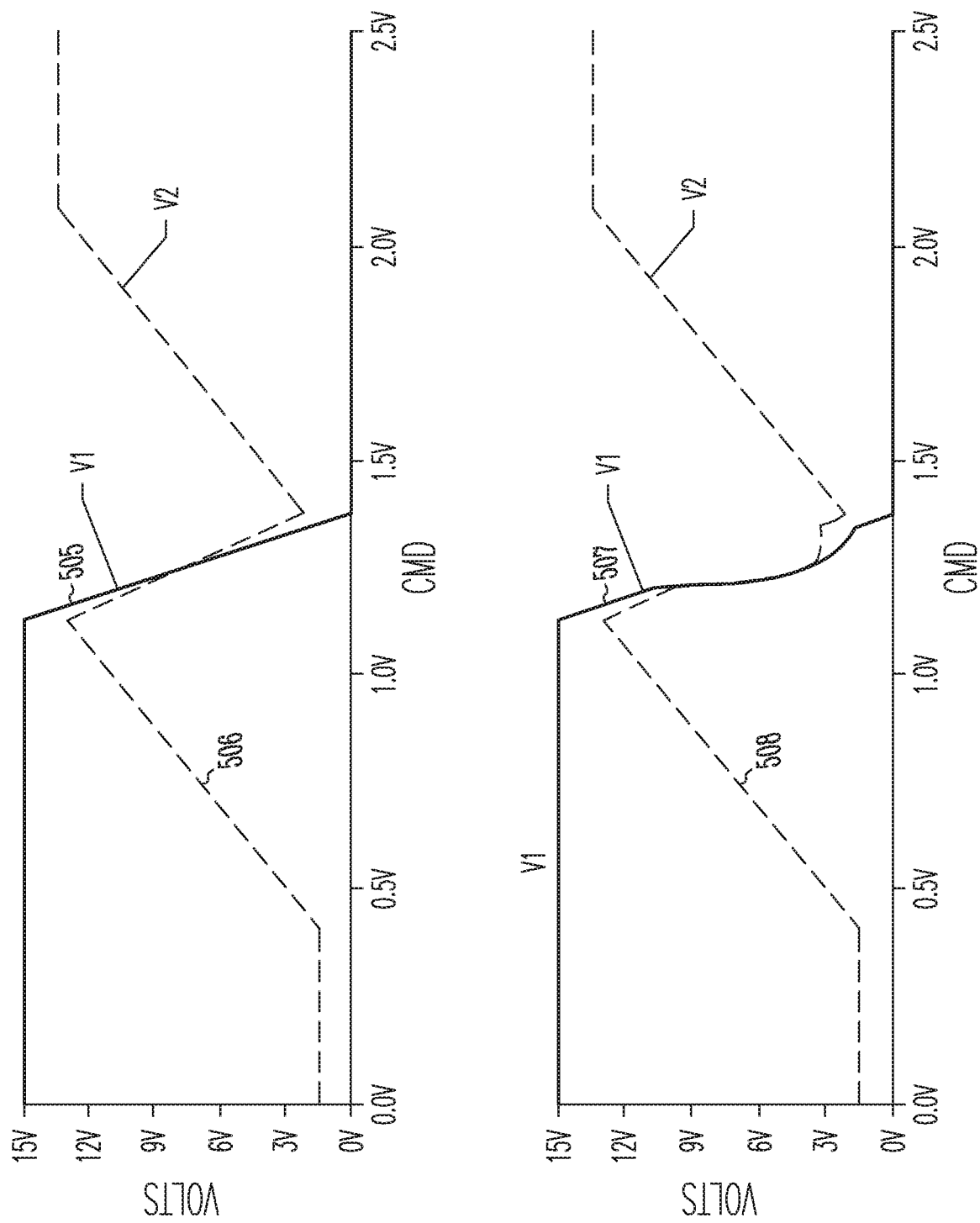

FIGS. 5A and 5B illustrate a comparison of the power dissipation and voltage characteristics of the example of FIG. 4 with operation of an uncompensated H-bridge system with a linear power stage. FIG. 5A graphically illustrates power dissipation 501 of a linear stage of an uncompensated H-bridge system and the power dissipation 502 of an H-bridge system employing the power compensation such as discussed above with respect to FIG. 4. FIG. 5A shows that the compensated linear stage can provide an upper power dissipation limit 503 that can be about half the peak power dissipation 504 of an uncompensated linear stage. FIG. 5B illustrates the output voltage 505 of the uncompensated linear stage of an uncompensated H-bridge system, the output voltage 506 of the switched stage of the uncompensated H-bridge system, the output voltage 507 of a compensated linear stage of a compensated H-bridge system and the output voltage 508 of a switched stage of the compensated H-bridge system. FIG. 5B illustrates that the transconductance amplifiers of the compensated linear stage change the output voltage 507 for a given command signal (CMD) as compared to the plot of the output voltage 505 of the uncompensated linear stage of the uncompensated system. The modified operation of the compensated linear stage works to limit the peak power dissipation of the linear stage by moving the output voltage 507 of the compensated linear stage toward an extreme of the supply voltage of the compensated linear stage when the power dissipation 501 reaches the designated limit (e.g., 503). In the illustrated example, as the command signal (CMD) moves as shown from left to right, the compensated linear stage operates to lower the output voltage 507 of the compensated linear stage faster than the output voltage 505 of the uncompensated linear stage of an uncompensated H-bridge system. In response to the operation of the compensated linear stage, the switched stage of the compensated H-bridge system can adjust its output voltage 508 via current regulation to maintain the desired differential voltage. As the power dissipation of the compensated linear stage becomes lower than the designated limit (e.g., 503), the operation of the compensated linear stage, in terms of output voltage at 507, can begin to mirror the operation of the uncompensated linear stage of the uncompensated H-bridge system.

Figure 6:
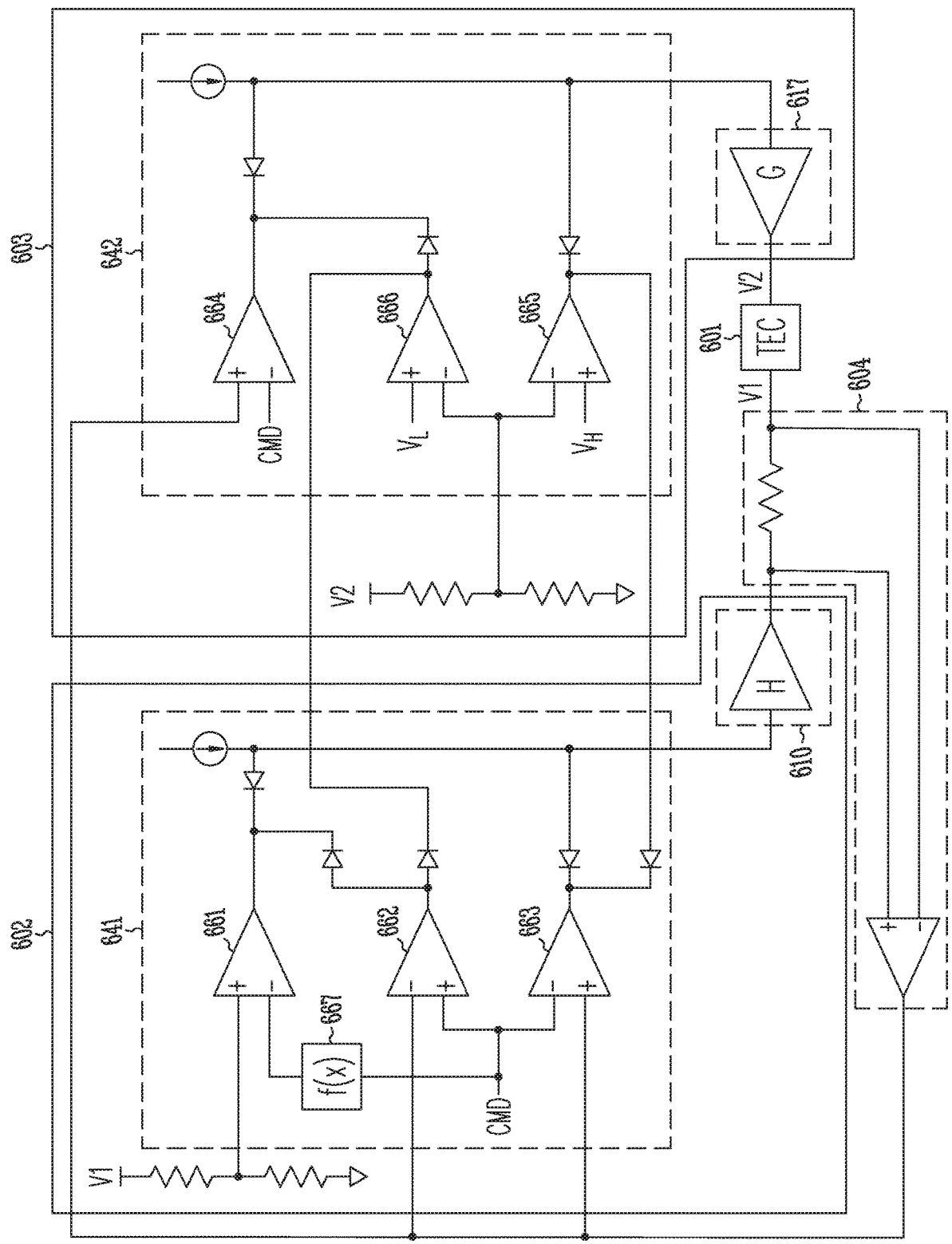
FIG. 6 illustrates generally an example H-bridge system according to the present subject matter.

FIG. 6 illustrates generally an example H-bridge system 600 according to the present subject matter. The system 600 can include or be coupled to a load, such as a thermoelectric device (TEC) 601. The system 600 can include a linear stage 602, a switched stage 603, and a current sensor 604. The linear stage 602 and the switched stage 603 can receive a supply voltage ($V_{IN}$, not shown) of a single polarity with respect to ground and can provide a differential voltage (e.g., V1−V2 or V2−V1) across the load (e.g., TEC 601) such as to provide dual polarity power to the TEC 601. An aspect of the system is the linear stage 602 can be operated in a current regulation mode as well as a voltage regulation mode. Such operation can accommodate features of a load such as the thermoelectric device 601 that do not behave like a resistor. For example, a thermoelectric device 601 can have a transfer function component that behaves like a resistor but can also have a transfer function component that depends on a temperature differential across the thermoelectric device 601. For example, voltage ($V_{TEC}$) across a thermoelectric device 601 can have the general form of, $$V_{TEC} = \Delta T \cdot S + I_{TEC} \cdot R_{TEC},$$

where:

$\Delta T$—Temperature difference between the plates of the thermoelectric device, S—Seebeck coefficient of the thermoelectric device, $I_{TEC}$—thermoelectric device current, $R_{TEC}$—thermoelectric device resistance.

With the extra $\Delta T \cdot S$ term in the above equation, even if small voltages are applied to the thermoelectric device, there can still be significant amount of current demand of the load. Such operation, if not compensated for, can result in unexpected power loss in a linear power stage of a H-bridge system when it is operating in the linear region. As an example, even when the voltage across the thermoelectric device 601 is zero ($V_{TEC}=0V$), the current ($I_{TEC}$) through the thermoelectric device can be on the order of $\Delta T \cdot S / R_{TEC}$. This can result in significant power dissipation in the linear stage when the voltage across the thermoelectric device 601 is zero volts. The example system 600 of FIG. 6 includes control circuitry 641, 642 to hand off current regulation operation between the switched stage 603 and the linear stage 602. In certain examples, the control circuitry 641, 642 can include several error amplifiers, a number of diodes, and a number of generated or received reference voltages ($V_L$, $V_H$). For the linear stage 602, the error amplifiers can include a voltage-regulation error amplifier 661, a high current regulation error amplifier 662, and a low current-regulation error amplifier 663. For the switched stage 603, the amplifiers can include current-regulation error amplifier 664, a high, voltage-regulation error amplifier 665, and a low, voltage-regulation error amplifier 666. The error amplifiers can provide multiple error signals.

For example, the current-regulation error amplifiers 662, 663, 664 can receive a representation of the load current from the current sensor 604. The voltage-regulation error amplifiers 661, 665, 666 can receive a representation of the output voltage (V1, V2) of the corresponding stage. For the linear stage 602, each of the voltage-regulation error amplifier 661 and the current-regulation amplifiers 662, 663 can receive the command signal (CMD) or a representation of the command signal (e.g., f(x), were x=CMD) such as a scaled (k CMD) representation, an offset representation, a scaled and offset representation, or other representation of the command signal (CMD). The output of each of the amplifiers 661, 662, 663 of the linear stage 602 can provide a linear command signal to power amplifier 610 of the linear stage 602. For the switched stage 603, the current-regulation error amplifier 664 can also receive the command signal (CMD) or a representation of the command signal. The voltage-regulation error amplifiers 665, 666 of the switched stage 603 can also receive a corresponding reference voltage ($V_H$, $V_L$). The output of each of the amplifiers 664, 665, 666 of the switched stage 603 can provide a control signal to the output stage 617 of the switched stage 604.

The voltage-regulation error amplifiers 665, 666 of the switched stage can limit the maximum and minimum output voltage (V2) of the switched stage 603 to the voltage represented by the respective reference voltage ($V_H$, $V_L$). For example, the respective reference voltages ($V_H$, $V_L$) can correspond to about the respective voltages capable of being produced at or near the corresponding maximum and minimum duty cycles of the switched stage 603. The current-regulation error amplifier 664 can regulate load current based on the command signal (CMD) and current feedback information from the current sensor 604. The current-regulation error amplifier output can be enabled when the representation of the output voltage (V2) of the switched stage 603 is between the reference voltages ($V_H$, $V_L$) applied to the voltage-regulation error amplifiers 665, 666. Thus, in certain examples, the output of the current-regulation error amplifier 664 of the switched stage 603 is enabled when the output of both the voltage-regulation error amplifiers 665, 666 of the switched stage 603 are disabled, and vice versa.

In a similar fashion, the current regulation error amplifiers 662, 663 of the linear stage can advantageously limit the slope of the output voltage (V1) of the linear stage 602 with respect to the command signal (CMD) when the switched stage 603 is in a voltage regulation mode of operation. The voltage-regulation error amplifier 661 can regulate the output voltage (V1) of the linear stage based on the command signal (CMD) and voltage feedback information. The current regulation-error amplifier outputs of the linear stage 602 can be enabled and disabled via the operation of the voltage-regulation error amplifiers 665, 666 of the switched stage 603 and the corresponding diode paths including a first diode (D1) of a first path and a second diode (D2) of a second path. Thus, in certain examples, the output of the voltage-regulation error amplifier 661 of the linear stage 602 can be enabled when the outputs of both the current-regulation error amplifiers 662, 663 of the linear stage 602 are disabled and vice versa.

Figure 7A:
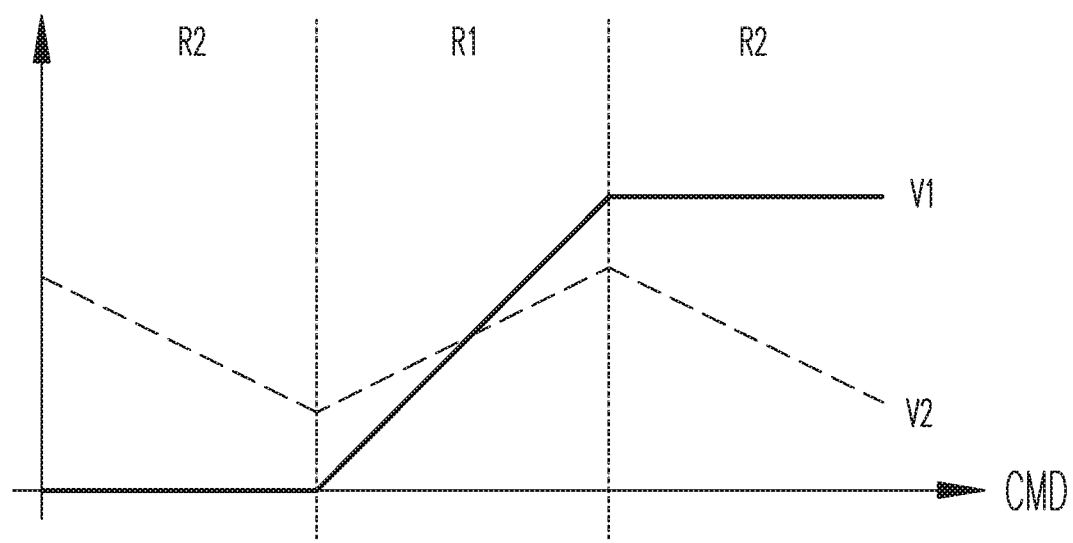
FIGS. 7A-7D illustrate graphically transfer functions of the example circuit of FIG. 6 under different load conditions and include the output voltage of the linear stage and the output voltage of the switched stage ach with respect to the command signal.

FIGS. 7A-7D illustrate graphically transfer functions of the example circuit of FIG. 6 under different load conditions and include the output voltage (V1) of the linear stage and the output voltage (V2) of the switched stage, each with respect to the command signal (CMD). FIG. 7A illustrates the transfer function of the example circuit of FIG. 6 when the load operates like a resistor with a relatively high resistance. Such a condition for a thermoelectric device can occur when the temperature difference across the thermo-electric device is zero ($\Delta T=0$). The differential voltage across the thermoelectric device as a function of the command signal (CMD) can include two regions (R1, R2). A first region (R1) can be given by a range of the command signal (CMD) where the output voltage (V1) of the linear stage transitions between the voltage supply extremes with a preconfigured slope in a voltage regulation mode and the switched stage is in a current regulation mode to provide the proper desired differential voltage based on the command signal (CMD). A second region (R2) can be defined by the voltage (V1) of the linear stage being pinned to one of the supply voltage extremes and the switched stage is in a current regulation mode to provide the proper differential voltage based on the command signal. In addition to having a temperature difference of zero, the load also provides enough resistance (e.g., $R_{TEC}$ for a thermo electric device) to prevent the switching stage from reaching an output voltage extreme.

Figure 7B:
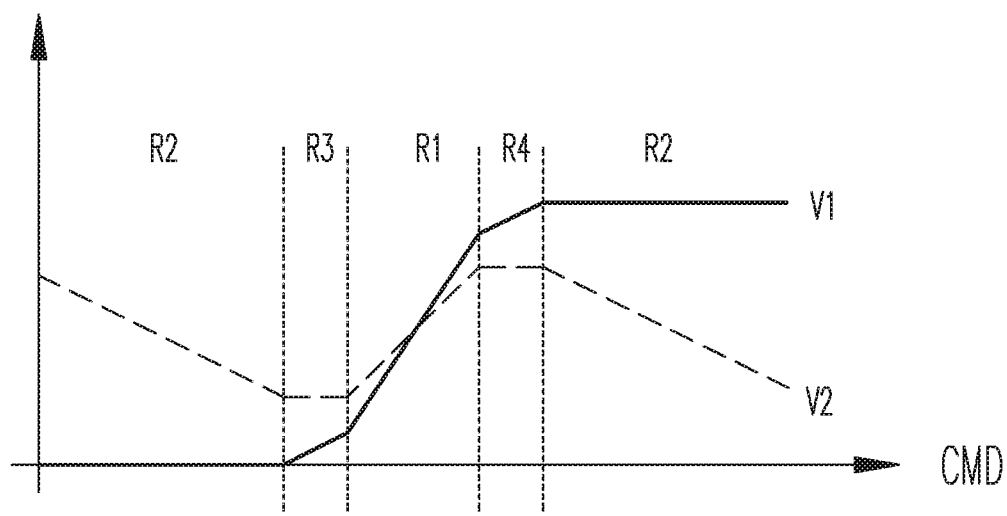

FIG. 7B illustrates the transfer function of the example circuit of FIG. 6 when the load operates like a resistor but with less resistance ($R_{TEC}$) than the load associated with the transfer function of FIG. 7A. In certain applications where the resistance ($R_{TEC}$) is low enough, the differential voltage across the load as a function of the command signal (CMD) can include four regions (R1, R2, R3, R4). A first region (R1) can be given by a range of the command signal (CMD) where the output voltage (V1) of the linear stage transitions between the voltage supply extremes with a preconfigured slope in a voltage regulation mode and the switched stage is in a current regulation mode to provide the proper differential voltage based on the command signal (CMD). A second region (R2) can be defined by a range of the command signal (CMD) over which the voltage (V1) of the linear stage being pinned to one of the supply voltage extremes and the switched stage is in a current regulation mode to provide the proper differential voltage based on the command signal. The third region (R3) can be defined by a range of the command signal (CMD) where the output voltage (V2) of the switched stage reaches a lower output voltage limit and the linear stage operates in a current regulation mode to provide the proper differential voltage based on the command signal (CMD). The fourth region (R4) can be a range of the command signal (CMD) where the switched stage reaches a upper output voltage limit and the linear stage operates in the current regulation mode to provide the proper differential voltage based on the command signal (CMD). In certain examples, the proportional current with respect to the command voltage (CMD) of a load, such as the thermoelectric load, can assist in ensuring power dissipation of the linear stage is minimized when, for example, the thermo-electric device is experiencing a non-zero temperature differential.

Figure 7C:
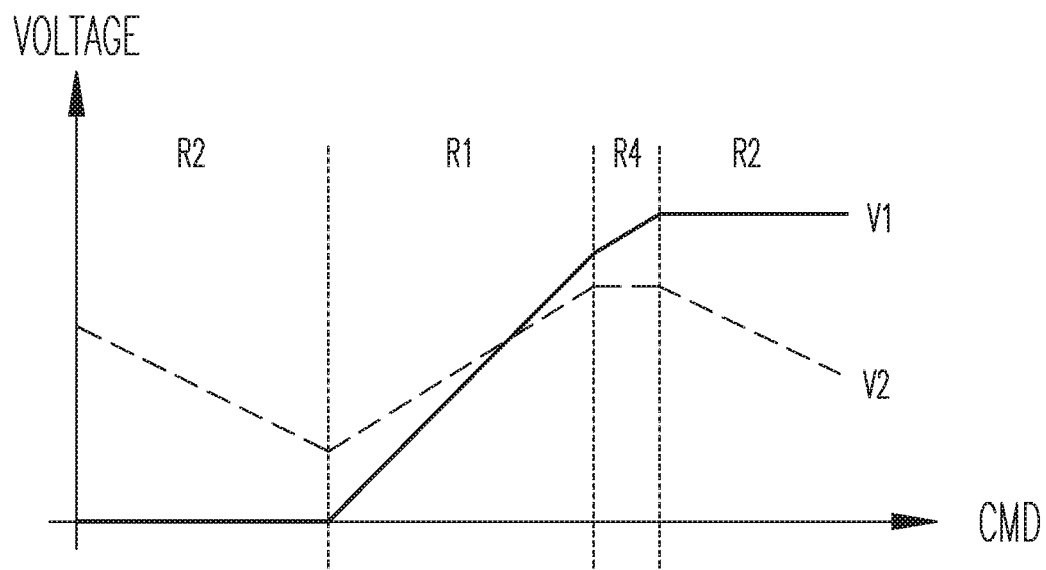

FIG. 7C illustrates the transfer function of the example circuit of FIG. 6 when a thermoelectric load has a temperature differential (e.g., ($\Delta T \neq 0$). The temperature differential can essential shift the output voltages (V1, V2) of the linear stage and the switched stage higher (or lower) across the operating range of the command signal (CMD) such that the output voltage (V2) of the switched power stage reaches at least one of the output voltage limits for a sub-range of the command signal (CMD). In the illustrated case of FIG. 7C the output voltage of the switched stage reaches the upper voltage limit for a sub range of the command signal (CMD). During operation in that sub-range of the command signal (CMD), the linear stage can switch to a current regulation mode to regulate the differential voltage of the H-bridge system and the transfer function can include the first, second and fourth regions (R1, R2, R4) as defined above with respect to FIG. 7B.

Figure 7D:
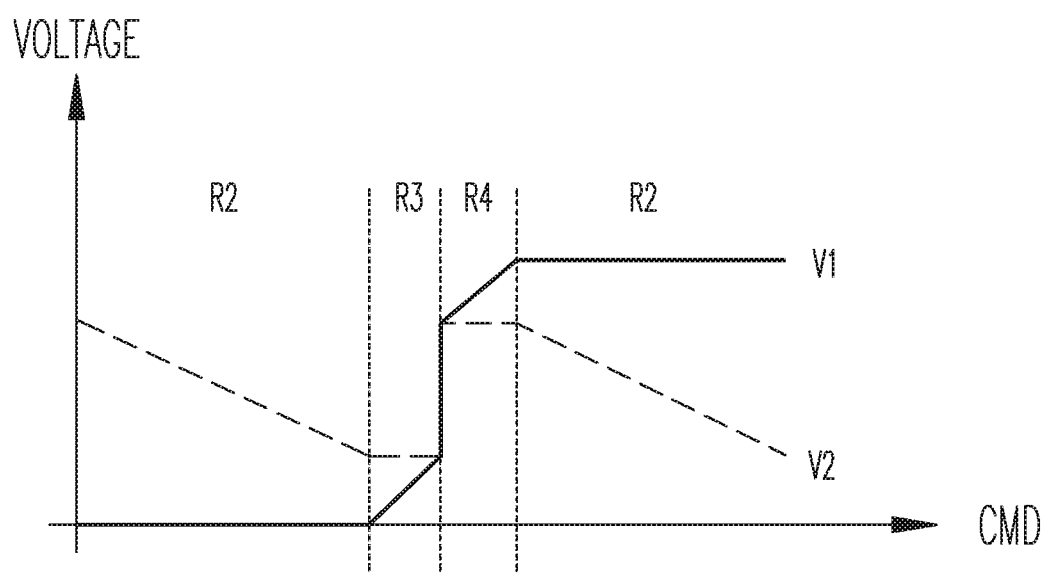

FIG. 7D illustrates a transfer function of a H-bridge system with the present principles for improving efficiency of the linear stage taken to the extreme. The transfer function essentially reduces the width of the first region (R1) with respect to the command signal (CMD). The slope of change of the linear stage output voltage with respect to the command signal can be set using a function block (See FIG. 6, 667). In some examples, the function block 667 may represent a gain, an offset, some other function, or combinations thereof. In certain examples, optimal efficiency can be achieved when the width of the first region (R1) is reduced as far as possible without introducing instability or unacceptable oscillation.

Figure 8:
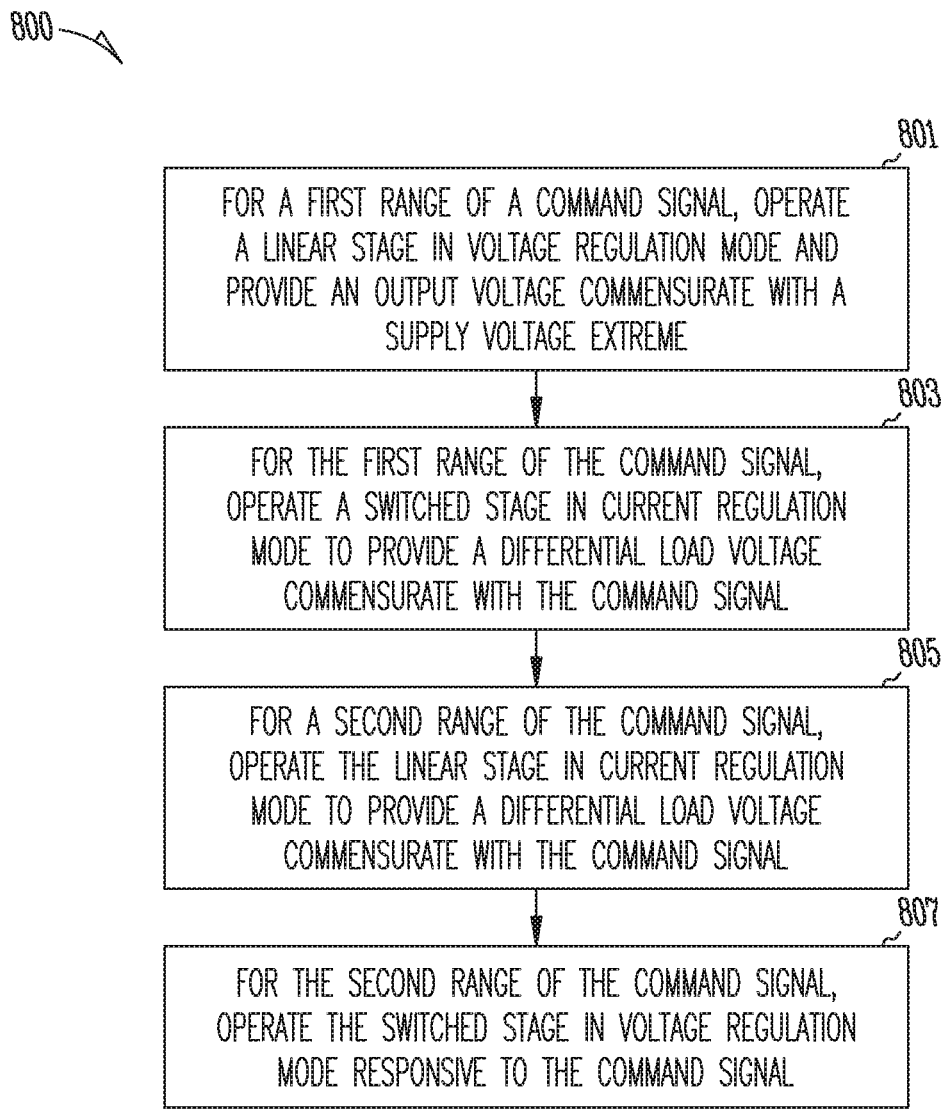
FIG. 8 illustrates generally an example method of operating a H-bridge system according to the present subject matter.

FIG. 8 illustrates generally an example method 800 of operating a H-bridge system according to the present subject matter. At 801, for a first range of a command signal, a linear stage of the H-bridge system can remain at a supply voltage extreme of the H-bridge system and can operate in a voltage regulation mode. At 803, for the first range of a command signal, a switched stage of the H-bridge system can operate in a current regulation mode to provide a differential voltage across a load of the H-bridge system commensurate with the command signal. The differential voltage can be defined as a difference between an output voltage of the linear stage and an output voltage of the switched stage. At 805, for a second range of the command signal, the linear stage can operate in a current regulation mode to provide a differential voltage across the load commensurate with the command signal. At 807, for the second range of the command signal, the switched stage can operate in a voltage regulation responsive to the command signal. In certain examples, for a third range of the command signal, the linear stage can operate in a voltage regulation mode and traverse a range of output voltages with a preconfigured slope and responsive to the command signal. Also, for the third range of the command signal, the switched stage can operate in a current regulation mode to provide a differential voltage across a load of the H-bridge system commensurate with the command signal.

EXAMPLES AND ADDITIONAL NOTES

In a first example, Example 1, a linear power stage for an H-bridge system, where the H-bridge system configured to couple to a load and to include a switched power stage, the load configured to receive power via a differential voltage supplied by a first output of the linear power stage and a second output of the switched power stage, can include a linear amplifier configured to receive power from a first supply rail and a second supply rail and to provide the first output, and a control circuit configured to receive a system command signal, a representation of current supplied to the load, a representation of a voltage drop across the linear amplifier, and multiple error signals of the switch supply device, the control circuit further configured to provide voltage regulation of the first output in response to the switched power stage providing current regulation of the second output, and to provide current regulation of the first output in response to the switched power stage providing voltage regulation of the second output.

In Example 2, the control circuit of Example 1 optionally includes a first error amplifier configured to receive the representation of the voltage drop and a representation of the system command signal and to provide a first linear command signal to the linear amplifier.

In Example 3, an output of the first error amplifier of any one or more Examples 1-2 optionally is coupled to an input of the linear amplifier via a first diode.

In Example 4, the linear power stage of any one or more of Examples 1-3 optionally includes a second error amplifier configured to receive the representation of the current supplied to the load and the system command signal and to provide a second linear command to the linear amplifier.

In Example 5, the linear power stage of any one or more of Examples 1-4 optionally includes a third error amplifier configured to receive the representation of the current supplied to the load and the system command signal and having an output configured to couple with a first error signal of the multiple error signals of the switched power stage.

In Example 6, an output of the second error amplifier of any one or more of Examples 1-5 optionally is configured to couple with a second error signal of the multiple error signals of the switched power stage.

In Example 7, the linear power stage of any one or more of Examples 1-6 optionally includes a second diode configured to couple the first error signal with the output of the second error amplifier.

In Example 8, the linear power stage of any one or more of Examples 1-7 optionally includes a second diode configured to couple the output of the third error amplifier with the first error signal.

In Example 9, the linear power stage of any one or more of Examples 1-8 optionally includes a third diode configured to couple the output of the third error amplifier with the first linear command signal.

In Example 10, an H-bridge system can include a load, a switched stage configured to couple to a first supply terminal of the load, to operate in a current regulation mode, and to establish a differential voltage across the load in response to a command signal, and a linear power stage configured to couple to a second terminal of the load. The linear power stage can include a power amplifier configured to provide a linear change in output voltage of the linear power stage in response to a change in the command signal, and a power limit circuit configured to provide a first slope of the output voltage of the linear power stage with respect to the command signal in response to the output voltage of the switched stage being between a first threshold and a second threshold, to provide a second slope of the output voltage of the linear power stage with respect to the command signal in response to the output voltage of the switched stage at or above the first threshold, and to provide the second slope of adjustment of the output voltage of the linear power stage with respect to the command signal in response to the output voltage of the switched stage at or below the second threshold, wherein the first slope is greater than the second slope and the first threshold is greater than the second threshold.

In Example 11, the switched stage of any one or more of Examples 1-10 optionally includes a first voltage-regulation error amplifier having an output coupled to an output of a first current-regulation error amplifier of the linear power stage.

In Example 12, the switched stage of any one or more of Examples 1-11 optionally includes a second voltage-regulation error amplifier having an output coupled to an output of a second current-regulation error amplifier of the linear power stage.

In Example 13, an input to the first voltage-regulation error amplifier of any one or more of Examples 1-12 optionally is the first threshold.

In Example 14, an input to the second voltage-regulation error amplifier of any one or more of Examples 1-13 optionally is the second threshold.

In Example 15, a method of operating a H-bridge circuit can include, for a first range of a command signal, operating a linear stage of the H-bridge circuit to provide an output voltage of the linear stage commensurate with a first supply voltage extreme, for the first range of the command signal, operating a switched stage of the H-Bridge circuit to provide a differential load voltage commensurate with the command signal, for a second range of the command signal, operating the linear stage to provide the differential load voltage commensurate with the command signal, and for the second range of the command signal, operating the switched stage of the H-bridge circuit to provide an output voltage of the switched stage commensurate with a voltage extreme of the switched stage.

In Example 16, for the first range of the command signal, the operating the linear stage any one or more of Examples 1-15 optionally includes operating the linear stage in a voltage regulation mode to provide the output voltage of the linear stage commensurate with the first supply voltage extreme.

In Example 17, for the first range of the command signal, the operating the switched stage any one or more of Examples 1-16 optionally includes operating the switched stage in a current regulation mode to provide the differential load voltage commensurate with the command signal.

In Example 18, for the second range of the command signal, the operating the linear stage any one or more of Examples 1-17 optionally includes operating the linear stage in a current regulation mode to provide the differential load voltage commensurate with the command signal.

In Example 19, for the second range of the command signal, the operating the switched stage any one or more of Examples 1-18 optionally includes operating the switched stage in a voltage regulation mode responsive to the command signal.

In Example 20, operating the switched stage in a voltage regulation mode any one or more of Examples 1-5 optionally includes regulating the output voltage of the switched stage at an upper or lower voltage threshold the switched stage.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more," In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein," Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A linear power stage for an H-bridge system, the H-bridge system configured to couple to a load and to include a switched power stage, the load configured to receive power via a differential voltage supplied by a first output of the linear power stage and a second output of the switched power stage, the linear power stage comprising:
a linear amplifier configured to receive power from a first supply rail and a second supply rail and to provide the first output; and
a control circuit configured to provide voltage regulation of the first output in response to the switched power stage providing current regulation of the second output, and to provide current regulation of the first output in response to the switched power stage providing voltage regulation of the second output.

2. The linear power stage of claim 1, wherein the control circuit includes a first error amplifier configured to receive a representation of a voltage drop across the linear amplifier and a system command signal and to provide a first linear command signal to the linear amplifier.

3. The linear power stage of claim 2, wherein an output of the first error amplifier is coupled to an input of the linear amplifier via a first diode.

4. The linear power stage of claim 2, including a second error amplifier configured to receive a representation of a current supplied to the load and the system command signal and to provide a second linear command signal to the linear amplifier.

5. The linear power stage of claim 4, including a third error amplifier configured to receive the representation of the current supplied to the load and the system command signal and having an output configured to couple with a first error signal of the switched power stage.

6. The linear power stage of claim 5, wherein an output of the second error amplifier is configured to couple with a second error signal of the switched power stage.

7. The linear power stage of claim 6, including a second diode configured to couple the first error signal with the output of the second error amplifier.

8. The linear power stage of claim 5, including a second diode configured to couple the output of the third error amplifier with the first error signal.

9. The linear power stage of claim 8, including a third diode configured to couple the output of the third error amplifier with the first linear command signal.

10. A system comprising:
a linear power stage comprising:
a power amplifier configured to provide a linear change in output voltage of the linear power stage in response to a change in a command signal; and
a power limit circuit configured to control the output voltage of the linear power stage to have a first slope characteristic with respect to the command signal in response to the output voltage of the switched stage being between a first threshold and a second threshold,
to control the output voltage of the linear power stage to have a second slope characteristic with respect to the command signal in response to the output voltage of the switched stage being at or above the first threshold, and
to control the output voltage of the linear power stage to have the second slope characteristic with respect to the command signal in response to the output voltage of the switched stage being at or below the second threshold,
wherein the first slope characteristic is greater than the second slope characteristic and the first threshold is greater than the second threshold.

11. The system of claim 10, wherein the switched stage includes a first voltage-regulation error amplifier having an output coupled to an output of a first current-regulation error amplifier of the linear power stage.

12. The system of claim 11, wherein the switched stage includes a second voltage-regulation error amplifier having an output coupled to an output of a second current-regulation error amplifier of the linear power stage.

13. The system of claim 12, wherein a first input to the first voltage-regulation error amplifier is the first threshold, and a second input to the second voltage-regulation error amplifier is the second threshold.

14. The system of claim 10, further comprising a switched power stage coupled to a first terminal of a load, the switched power stage configured to operate in a current regulation mode, and to establish a differential voltage across the load in response to the command signal;
wherein the linear power stage is coupled to a second terminal of the load.

15. A method of operating a H-bridge circuit, the method comprising:
for a first range of a command signal, operating a linear stage of the H-bridge circuit to provide an output voltage of the linear stage commensurate with a first supply voltage;
for the first range of the command signal, operating a switched stage of the H-Bridge circuit to provide a differential load voltage commensurate with the command signal;
for a second range of the command signal, operating the linear stage to provide the differential load voltage commensurate with the command signal; and
for the second range of the command signal, operating the switched stage to provide an output voltage of the switched stage commensurate with a voltage extreme of the switched stage.

16. The method of claim 15, wherein, for the first range of the command signal, the operating the linear stage includes operating the linear stage in a voltage regulation mode to provide the output voltage of the linear stage commensurate with the first supply voltage.

17. The method of claim 15, wherein, for the first range of the command signal, the operating the switched stage includes operating the switched stage in a current regulation mode to provide the differential load voltage commensurate with the command signal.

18. The method of claim 15, wherein, for the second range of the command signal, the operating the linear stage includes operating the linear stage in a current regulation mode to provide the differential load voltage commensurate with the command signal.

19. The method of claim 15, wherein, for the second range of the command signal, the operating the switched stage includes operating the switched stage in a voltage regulation mode responsive to the command signal.

20. The method of claim 19, wherein operating the switched stage in a voltage regulation mode includes regulating the output voltage of the switched stage at an upper or lower voltage threshold the switched stage.

\* \* \* \* \*